(12) United States Patent
Yamazaki et al.

(10) Patent No.: US 6,268,842 B1
(45) Date of Patent: Jul. 31, 2001

(54) THIN FILM TRANSISTOR CIRCUIT AND SEMICONDUCTOR DISPLAY DEVICE USING THE SAME

(75) Inventors: Shunpei Yamazaki, Tokyo; Jun Koyama, Kanagawa, both of (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/289,306

(22) Filed: Apr. 9, 1999

(30) Foreign Application Priority Data

Apr. 13, 1998 (JP) .................................................. 10-117827

(51) Int. Cl.$^7$ ...................................................... G09G 3/36
(52) U.S. Cl. ............................ 345/98; 345/100; 330/257; 330/288
(58) Field of Search ................................ 345/98, 100, 87, 345/204, 205, 206; 330/253, 257, 288, 252; 315/169.1–169.3

(56) References Cited

U.S. PATENT DOCUMENTS

| | | | |
|---|---|---|---|
| 4,797,629 | * 1/1989 | Widlar | 330/258 |
| 5,166,671 | 11/1992 | Maekawa | 340/784 |
| 5,335,023 | 8/1994 | Edwards | 348/800 |
| 5,357,290 | 10/1994 | Horibe | 348/792 |
| 5,680,149 | 10/1997 | Koyama et al. | 345/98 |
| 5,942,856 | * 8/1999 | Koyama | 315/169.3 |

FOREIGN PATENT DOCUMENTS

| | | |
|---|---|---|
| 7-130652 | 5/1995 | (JP) . |
| 7-135318 | 5/1995 | (JP) . |
| 8-78329 | 3/1996 | (JP) . |

OTHER PUBLICATIONS

Ohtani, H. et al, "Late–News Poster: A 60–in. HDTV Rear–Projector with Continuous–Grain–Silicon Technology," Society for Information Display, International Symposium Digest of Technical Papers, Anaheim California, May 17–22, *SID Digest,* vol. XXIX, pp. 467–470.
English abstract re JP 7–135318 to Semiconductor Energy Laboratory Co., Ltd.
English abstract re JP 7–130652 to Semiconductor Energy Laboratory Co., Ltd.
English abstract re JP 8–78329 to Semiconductor Energy Laboratory Co., Ltd.

* cited by examiner

*Primary Examiner*—Lun-Yi Lao
(74) *Attorney, Agent, or Firm*—Cook, Alex, McFarron, Manzo, Cummings & Mehler, Ltd.

(57) ABSTRACT

There is provided a thin film transistor circuit used for a driver circuit for providing a semiconductor display device without a picture blur and with high fineness/high resolution. In the thin film transistor circuit, a TFT having a large size (channel width) is not used, but a plurality of TFTs each having a small size are connected in parallel to each other and are used. By this, while sufficient current capacity of the thin film transistors is secured, fluctuation in the characteristics can be decreased.

30 Claims, 10 Drawing Sheets

THIN FILM TRANSISTOR CIRCUIT AND SEMICONDUCTOR DISPLAY DEVICE USING THE SAME

BACKGROUND OF THE INVENTION

1. Field of the Invention

The present invention relates to a driver circuit for a semiconductor display device using thin film transistors. Particularly, the invention relates to a differential amplifying circuit and a buffer using the same, which is used for a driver circuit of an active matrix type semiconductor display device. Moreover, the invention relates to a semiconductor display device using the driver circuit.

2. Description of the Related Art

In recent years, a technique for manufacturing a thin film transistor (TFT) using a semiconductor thin film formed on an inexpensive glass substrate has been rapidly developed. The reason is that the demand for an active matrix type liquid crystal display device and an electroluminescence (EL) display device has been increased.

In the active matrix type liquid crystal display device, a TFT is disposed for each of several hundred thousands to millions of pixels arranged in matrix, and an electric charge going in and out of each pixel electrode is controlled by a switching function of the TFT.

FIG. 10 shows a structure of a conventional active matrix type liquid crystal display device. Shift registers and buffer circuits are generically called a driver circuit, and are integrally formed on the same substrate together with an active matrix circuit in recent years. Reference numeral 1001 denotes a source signal line side driver circuit, and 1002 denotes a gate signal line side driver circuit.

Reference numeral 1003 denotes an active matrix circuit, and pixel TFTs 1004 are disposed in matrix. A pixel electrode is connected to a drain electrode of each of the pixel TFTs 1004. A liquid crystal material is put between the pixel electrode and its opposite electrode and is sealed. An auxiliary capacitor 1006 for holding an electric charge is provided for each of the pixel TFTs 1004.

There is also known a structure in which quartz is used for a substrate and a thin film transistor is manufactured with a polycrystal silicon film.

There is also known a technique in which a thin film transistor using a crystalline silicon film is manufactured on a glass substrate by using a technique such as laser annealing. When this technique is used, it is possible to integrate an active matrix circuit and a driver circuit on the glass substrate.

In the structure shown in FIG. 10, a picture signal supplied to a picture signal line is selected by a timing signal from a shift register circuit of the source signal line side driver circuit. Then a designated picture signal is supplied to a corresponding source signal line. A timing signal from the gate signal line side driver circuit is supplied to a corresponding gate signal line (scanning line). The picture signal supplied to the source signal line is written in the pixel electrode of a thin film transistor of a pixel selected by the timing signal from the gate signal line.

By sequentially repeating the foregoing operation at suitable timing, information is sequentially written in the respective pixels arranged in matrix.

When picture information for one picture (one frame) is written, writing of picture information for a next picture is carried out. In this way, display of a picture is sequentially carried out. In general, writing of information for one picture is carried out 30 times or 60 times per second.

Here, an example of the source signal line side driver circuit will be shown in FIG. 11. Reference numeral 1100 denotes a clock input terminal, 1101 denotes a clock line, 1102 denotes a start pulse input terminal, 1103 to 1105 denote shift registers, 1106 to 1111 denote inverter-type buffers, 1112 denotes a video signal input terminal, 1113 denotes a video signal line, 1114 to 1116 and 1120 to 1122 denote switches, 1117 to 1119 and 1125 to 1127 denote holding capacitors, 1123 denotes a transfer signal input terminal, 1124 denotes a transfer signal line, 1128 to 1130 denote analog buffers, and 1131 to 1133 denote source signal line connection terminals.

In the case of analog gradation, a video signal which is continuous in time series is used as a gradation signal inputted to the source signal line side driver circuit. In the case of a normally white mode (display mode in which white display is effected when a voltage is not applied to a liquid crystal), it is set such that as an absolute value of a voltage of a gradation signal becomes large, the display approaches black display. With respect to the shift registers 1103 to 1105, a start pulse synchronous with a video signal is inputted to the start pulse input terminal 1102, and is sequentially shifted by a clock pulse inputted from the clock pulse line. The output of the shift registers 1103 to 1105 is inputted into a sampling circuit through the inverter-type buffers 1106 to 1111.

The sampling circuit is constituted of the switches 1114 to 1116 and the holding capacitors 1117 to 1119. The switches 1114 to 1116 are sometimes called transmission gates. Turning On or OFF of the switches 1114 to 1116 is controlled by the buffer circuits. In the ON state, the video signal line is short-circuited to the holding capacitors 1117 to 1119, and electric charges are stored in the holding capacitors 1117 to 1119. When a start pulse is inputted and the pulse passes through the shift registers, the output of the buffer circuits is inverted, and the switches 1114 to 1116 are turned OFF.

When the switches 1114 to 1116 are turned OFF, the electric charges stored in the holding capacitors 1117 to 1119 are held, and the electric potential is held until the next time the switches 1114 to 1116 are turned ON. In a period between a time point when sampling of video data for one line is ended and a time point when sampling for the next line is started, a transfer signal is inputted from the transfer signal input terminal 1123, and this transfer signal is supplied from the transfer signal line. The switches 1120 to 1122 are turned ON by this transfer signal, electric charges are stored in the holding capacitors 1125 to 1127, and the electric potentials of the holding capacitors 1117 to 1119 are transferred to the holding capacitors 1125 to 1127. When the switches 1120 to 1122 are turned OFF, the electric potentials of the holding capacitors 1125 to 1127 are held.

The holding capacitors 1125 to 1127 are connected with the analog buffers 1128 to 1130, and the source signal lines 1131 to 1133 are driven through the analog buffers 1128 to 1130. These analog buffers 1128 to 1130 are circuits necessary for driving the source signal lines without affecting the electric potentials of the holding capacitors.

Here, an example of a conventional circuit used for the analog buffers 1128 to 1130 will be shown in FIG. 12. Reference numeral 1201 denotes a terminal to which a holding capacitor is connected, and which is an input end of a signal. Reference numeral 1202 denotes a terminal to which a source signal line is connected, and which is an output end of a signal. Reference numeral 1203 denotes a constant current source, 1204 denotes a constant voltage source, 1205 and 1206 denote P-channel TFTs, and 1207 and

1208 denote N-channel TFTs. In the analog buffer of FIG. 12, a differential circuit A is constituted of the P-channel TFTs, and a current mirror circuit B is constituted of the N-channel TFTs.

The operation of the analog buffer of FIG. 12 will be described. In the case where the electric potential of the input end 1201 of the differential circuit connected to the holding capacitor is increased, an input current of the current mirror circuit 1210 connected to a reversed-phase output of the input end 1201 is decreased, and the output current of the current mirror circuit 1210 is decreased in proportion to that. On the other hand, a current of the same phase at the input end is increased, so that the electric potential at the output end 1202 is increased and reaches the same electric potential as that at the input end of the differential circuit. Thus, the electric potential of the source signal line connected to the output end 1202 becomes the same electric potential as that of the input end.

In recent years, with rapid increase of the amount of information to be processed, enlargement in display capacity and improvement in fineness of display resolution have been intended. Here, examples of generally used display resolutions for a computer will be shown with the number of pixels and the standard name in the following.

| Number of pixels (horizontal × vertical) | Standard Name |
| --- | --- |
| 640 × 400 | EGA |
| 640 × 480 | VGA |
| 800 × 600 | SVGA |
| 1024 × 768 | XGA |
| 1280 × 1024 | SXGA |

In recent years, in the field of a personal computer as well, since software making a plurality of displays different from each other in character on a display screen has come into wide use, a display device has shifted to one corresponding to the XGA or SXGA standard higher in display resolution than the VGA or SVGA standard. An active matrix type liquid crystal display device is very frequently used also in the field of a personal computer, and has become popular as a display device for not only a notebook computer but also a desktop personal computer.

Moreover, the active matrix type liquid crystal display device with the high display resolution has been used for display of television signals in addition to display of data signals in a personal computer.

Such a buffer is meaningless if its current capacity is small, and a buffer having a large current capacity to a certain degree is required. In the case where a buffer having a large current capacity is formed of a thin film transistor, a TFT having a large current capacity, that is, a large channel width is required. If a size (channel width) of a TFT is simply enlarged to realize a buffer with a sufficiently large buffer, only the center portion of the TFT functions as a channel, and the side portions do not function as the channel, so that there is a case that deterioration of the TFT is accelerated.

Further, when the size of a TFT is large, self heat generation of the TFT becomes large, which may cause a change of a threshold value or deterioration to occur.

In a TFT having a large channel width, fluctuation in crystallinity occurs in a component, and as a result, fluctuation in a threshold voltage occurs among each TFT. Thus, it is inevitable that fluctuation occurs also in the characteristics of buffers each constituted of a plurality of TFTs. Thus, there exist buffers having fluctuated characteristics for each signal line, and the fluctuation in the characteristics directly causes fluctuation in applied voltages to a pixel matrix circuit.

In the case where a liquid crystal is driven with an applied voltage of 5 V, and in the case where 8-gradation display is made, a voltage range for one gradation is 5 V/8 gradations= 625 mV/gradation, and similarly, the voltage range becomes 313 mV in the case where 16-gradation display is made, 156 mV in the case where 32-gradation display is made, 78 mV in the case where 64-gradation display is made, 39 mV in the case where 128-gradation display is made, and 20 mV in the case where 256-gradation display is made.

In the case where an active matrix type liquid crystal display device is applied to a three-plate type projector, it is necessary to make 256-gradation display in order to realize full color display. Thus, as described above, if fluctuation in applied voltage occurs for every source signal line, a display blur in the entire of the display device appears, and excellent display can not be made.

In the gate signal line side driver circuit as well, a scanning signal is sequentially supplied to a gate signal line (scanning line) on the basis of a timing signal from a shift register. In the gate signal line side driver circuit, all pixel TFTs for one line connected to one scanning line must be driven, and a load capacity connected to one scanning line is large. Thus, also in the gate signal line side driver circuit, there is a case where it becomes necessary to eliminate "dulling" by making the timing signal from the shift register pass through a buffer circuit or the like. In this case as well, a buffer having a large current capacity is necessary, so that the above described problems come to occur. Especially, the buffer of the gate signal line must drive all of the connected TFTs for one line in the pixel matrix circuit, so that the fluctuation in the characteristics of the buffer causes a remarkable picture blur. This is one of the most serious problems when a display device with high fineness/high resolution is desired.

SUMMARY OF THE INVENTION

The present invention has been made to solve the foregoing problems, and an object thereof is to provide a buffer in which even in the case where there is a difference in characteristics of each TFT, these differences of characteristics can be canceled. Another object of the invention is to provide a driver circuit of an active matrix type semiconductor display device, which uses this buffer with little fluctuation. Still another object of the invention is to provide a semiconductor display device using this driver circuit of the invention and capable of obtaining an excellent picture without a picture blur and with high fineness/high resolution.

The structure of the present invention will be described below.

According to one aspect of the invention, a thin film transistor circuit is provided, which comprises at least: a differential circuit including x (x is a natural number not less than 2) input-side thin film transistors which have a common gate electrode potential and to which a signal is inputted, and x output-side thin film transistors which have a common gate electrode potential and from which a signal is outputted; and a current mirror circuit including y (y is a natural number not less than 2) input-side thin film transistors and y output-side thin film transistors, which have a common gate electrode potential, the gate electrodes of y input-side thin film transistors being connected to source/drain regions of y input-side thin film transistors. By this, the above-mentioned objects can be achieved.

According to another aspect of the present invention, a thin film transistor circuit is provided, which comprises at least: a differential circuit including x (x is a natural number not less than 2) input-side thin film transistors which have a common gate electrode potential and to which a signal is inputted, and (n×x) (n is a natural number not less than 2) output-side thin film transistors which have a common gate electrode potential and from which a signal is outputted; and a current mirror circuit including y (y is a natural number not less than 2) input-side thin film transistors and (n×y) output-side thin film transistors, which have a common gate electrode potential, the gate electrodes of y input-side thin film transistors being connected to source/drain regions of y input-side thin film transistors. By this, the above-mentioned objects can be achieved.

According to still another aspect of the invention, a semiconductor display device is provided, which comprises: a pixel matrix circuit; and a driver circuit comprising at least a thin film transistor circuit using at least: a differential circuit including x (x is a natural number not less than 2) input-side thin film transistors which have a common gate electrode potential and to which a signal is inputted, and x output-side thin film transistors which have a common gate electrode potential and from which a signal is outputted; and a current mirror circuit including y (y is a natural number not less than 2) input-side thin film transistors and y output-side thin film transistors, which have; a common gate electrode potential, the gate electrodes of y input-side thin film transistors being connected to source/drain regions of y input-side thin film transistors, wherein the pixel matrix circuit and the driver circuit are formed on the same substrate. By this, the above-mentioned objects can be achieved.

According to still another aspect of the invention, a semiconductor display device is provided, which comprises: a pixel matrix circuit; and a driver circuit comprising at least a thin film transistor circuit using at least: a differential circuit including x (x is a natural number not less than 2) input-side thin film transistors which have a common gate electrode potential and to which a signal is inputted, and (n×x) (n is a natural number not less than 2) output-side thin film transistors which have a common gate electrode potential and from which a signal is outputted; and a current mirror circuit including y (y is a natural number not less than 2) input-side thin film transistors and (n×y) output-side thin film transistors, which have a common gate electrode potential, the gate electrodes of y input-side thin film transistors being connected to source/drain regions of y input-side thin film transistors, wherein the pixel matrix circuit and the driver circuit are formed on the same substrate. By this, the above-mentioned objects can be achieved.

DETAILED DESCRIPTION OF THE PREFERRED EMBODIMENTS

Figure 1:
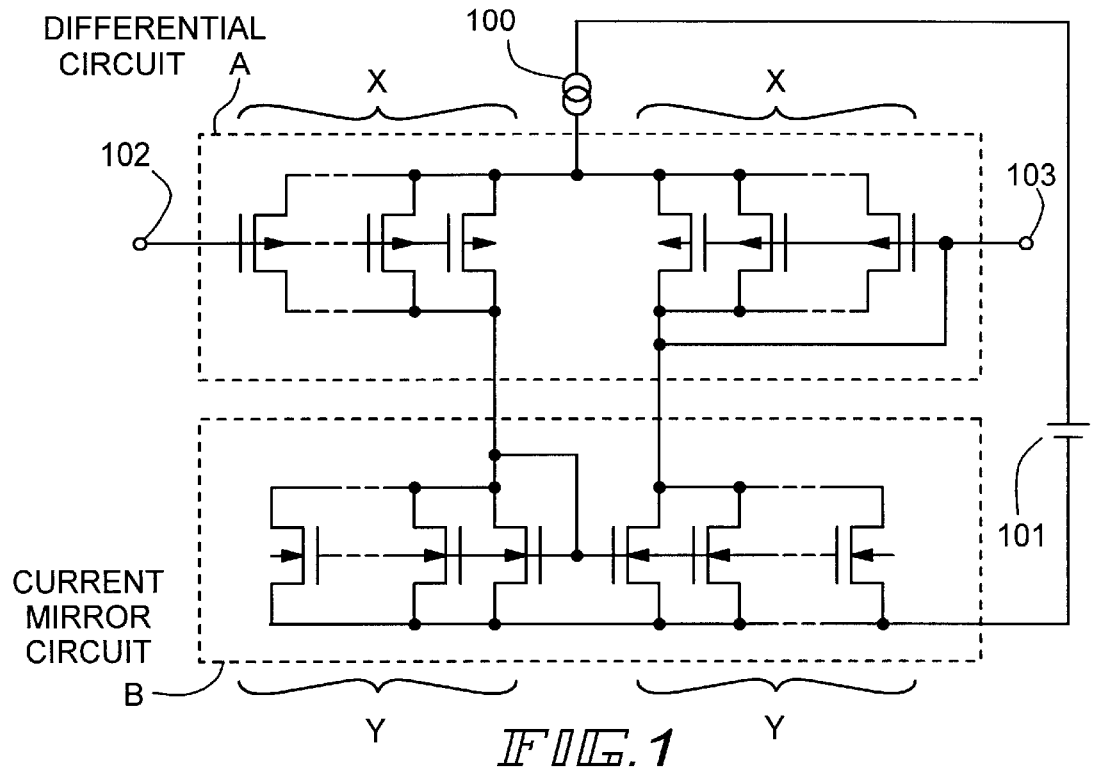
FIG. 1 is a view showing a thin film transistor circuit of the present invention.

The present invention will be described with reference to FIG. 1. FIG. 1 is a view showing a circuit structure of a thin film transistor circuit of the present invention. A portion A encircled with a dotted line forms a differential circuit, and a portion B encircled with a dotted line formes a current mirror circuit. The differential circuit is connected to a constant current source 100, and the current mirror circuit is connected to a constant voltage source 101.

The differential circuit includes x input-side thin film transistors connected to an input end 102 and having a common gate electrode potential, and x output-side thin film transistors connected to an output terminal 103 and having a common gate electrode potential (x is a natural number not less than 2). Source/drain regions of x input-side thin film transistors connected to the input end 102 and having the common gate electrode potential are connected to each other so as to have a common electric potential. Source/drain regions of the x output-side thin film transistors connected to the output terminal 103 and having the common gate electrode potential are connected to each other so as to have a common electric potential. The gate electrodes of the x output-side thin film transistors are connected to their source/drain regions. That is, the differential circuit of the present invention is formed by dividing an output-side thin film transistor and an input-side thin film transistor constituting a conventional differential circuit into x thin film transistors, respectively, and by connecting them in parallel to each other.

On the other hand, the current mirror circuit includes y input-side thin film transistors connected to the source/drain regions of the input-side x thin film transistors of the differential circuit and having a common gate electrode potential, and y output-side thin film transistors connected to the source/drain regions of x output-side thin film transistors of the differential circuit and having a common gate electrode potential (y is a natural number not less than 2). The gate electrodes of y input-side thin film transistors and the gate electrodes of y output-side thin film transistors have a common electric potential. These gate electrodes are connected to the source/drain regions of the y input-side thin film transistors. In other words, the current mirror circuit of the present invention is also formed by dividing a thin film transistor constituting a conventional current mirror circuit into y or z thin film transistors and by connecting them in parallel to each other.

The polarities of the thin film transistors used in the differential circuit and the current mirror circuit are reverse to each other. In FIG. 1, P-channel thin film transistors are used in the differential circuit, and N-channel thin film transistors are used in the current mirror circuit. The polarities of the P type and N type may be reversed. However, if they are the same, the circuit does not work.

In the thin film transistor circuit of the present invention shown in FIG. 1, a TFT having a large size (channel width) is not used, but a plurality of TFTs each having a small size are connected to each other in parallel and are used. By this, while sufficient current capacity of thin film transistors can be secured, the fluctuation in the characteristics can be reduced.

The present invention will be described in more detail with reference to the following embodiments.

[Embodiment 1]

Figure 2:
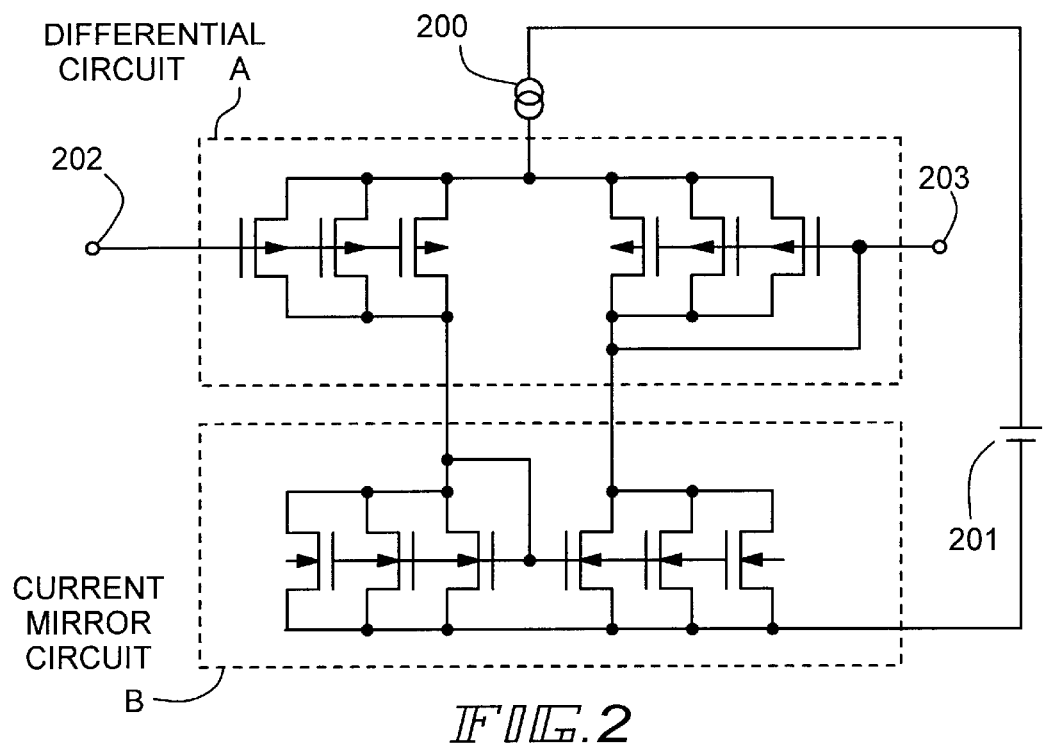
FIG. 2 is a view showing an embodiment of a thin film transistor circuit of the present invention.

FIG. 2 shows an embodiment of the present invention. FIG. 2 shows a case where the structure of the present invention is used for an analog buffer of a source signal line side driver circuit of an active matrix type semiconductor display device. In the analog buffer of this embodiment, x=y=3.

The analog buffer shown in FIG. 2 is constituted of a differential amplifier of a circuit A encircled with a dotted line and a current mirror circuit of a circuit B encircled with a dotted line. The channel width of each of six P-channel TFTs constituting the differential amplifier is 30 $\mu$m. The channel width of each of N-channel TFTs constituting the current mirror circuit is 30 $\mu$m.

In this embodiment, although the number of TFTs constituting the differential circuit is equal to the number of TFTs constituting the current mirror circuit, it is not always necessary to make the number equal to each other. Besides, although the channel width of each TFT is 30 $\mu$m, it is satisfactory if the width is 100 $\mu$m or less (preferably 90 $\mu$m or less).

In the following, an example of a manufacturing method of an active matrix type liquid crystal display device, as an active matrix type semiconductor display device including a driver circuit with an analog buffer of this embodiment, will be described. Incidentally, the manufacturing method described below is merely one method that realizes the present invention, and the active matrix type liquid crystal display device including the thin film transistor circuit of the present invention can be realized also by other manufacturing methods.

Here, an example in which a plurality of TFTs are formed on a substrate having an insulating surface, and a pixel matrix circuit, a driver circuit, a logic circuit, and the like are monolithically formed, will be described with references to FIGS. 3 to 6. In this embodiment, a state in which one pixel of a pixel matrix circuit and a driver circuit including an analog buffer of the present invention, logic circuit, etc. are formed at the same time on the same substrate, will be shown. In this embodiment, although manufacturing steps will be described for the case where each of P-channel TFTs and N-channel TFTs includes one gate electrode, a CMOS circuit of TFTs each having a plurality of gate electrodes, such as a double gate type or triple gate type TFT, can also be manufactured in the same way.

Figure 8:
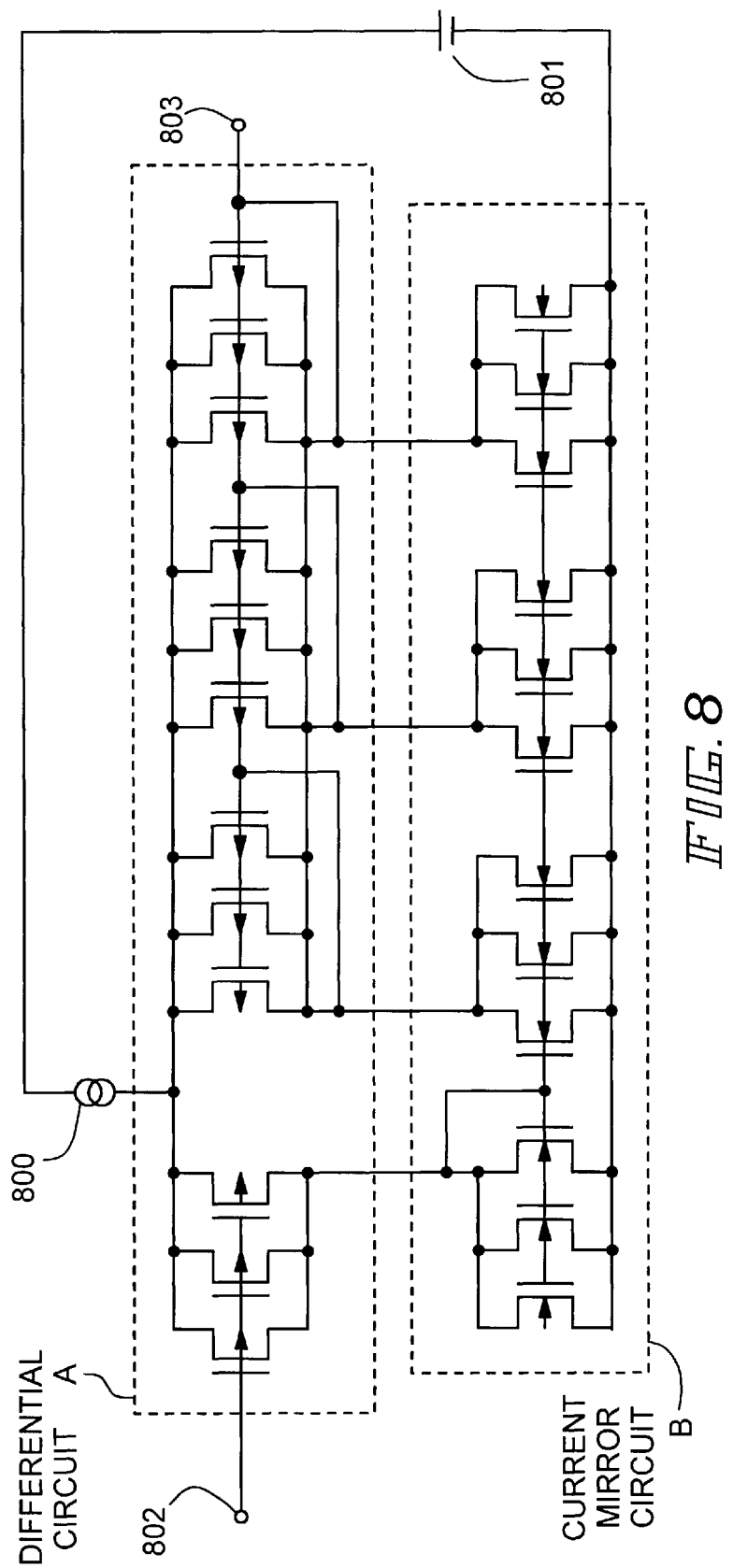
FIG. 8 is a view showing another embodiment of a thin film transistor circuit of the present invention.

Moreover, in FIGS. 3 to 6, although the driver circuit is shown in a CMOS structure having one P-channel TFT and one N-channel TFT, each of the P-channel TFT and N-channel TFT can be applied in the driver circuits of the present invention shown in FIGS. 1, 2, and 8.

Reference will be made to FIGS. 3A to 3D. First, a quartz substrate 301 is prepared as a substrate having an insulating surface. Instead of the quartz substrate, a silicon substrate on which a thermal oxidation film is formed may be used. Moreover, such a method may be adopted that an amorphous silicon film is temporarily formed on a quartz substrate and the film is completely thermally oxidized to form an insulating film. In addition, a quartz substrate or a ceramic substrate each having a silicon nitride film formed as an insulating film may be used.

An amorphous silicon film 302 is formed on the substrate 301 by a low pressure CVD method, a plasma CVD method, or a sputtering method. Adjustment is made so that the final film thickness (film thickness determined after taking into consideration a film decrease subsequent to thermal oxidation) of the amorphous silicon film 302 becomes 10 to 100 nm (preferably 30 to 60 nm). In the film formation, it is important to thoroughly control the concentration of impurities in the film.

In this embodiment, although the amorphous silicon film 302 is formed on the substrate 301, another semiconductor thin film may be used instead of the amorphous silicon film. For example, it is also possible to use a compound of silicon and germanium expressed by $Si_xGe_{1-x}$ (0<X<1).

In the case of this embodiment, control is made so that the concentration of each of C (carbon) and N (nitrogen), which are impurities to block crystallization in the amorphous silicon film 302, becomes less than $5 \times 10^{18}$ atoms/cm$^3$ (typically $5 \times 10^{17}$ atoms/cm$^3$ or less, preferably $2 \times 10^{17}$ atoms/cm$^3$), and the concentration of O (oxygen) becomes less than $1.5 \times 10^{19}$ atoms/cm$^3$ (typically $1 \times 10^{18}$ atoms/cm$^3$ or less, preferably $5 \times 10^{17}$ atoms/cm$^3$ or less). This is because if the concentration of any one of the impurities exceeds the above value, the impurity has a bad influence at subsequent crystallization and causes the film quality to be degraded after the crystallization. In the present specification, the foregoing concentration of the impurity in the film is defined as a minimum value in measurement results of SIMS (Secondary Ion Mass Spectroscopy).

In order to obtain the above structure, it is desirable to periodically carry out dry cleaning to a low pressure CVD furnace used in this embodiment so that a film growth chamber is cleaned. It is appropriate that the dry cleaning of the film growth chamber is carried out by flowing a $ClF_3$ (chlorine fluoride) gas of 100 to 300 sccm into the furnace heated up to about 200 to 400° C. and by using fluorine produced by pyrolysis.

According to the knowledge of the present applicant, in the case where the temperature in the furnace is 300° C. and the flow rate of the $ClF_3$ (chlorine fluoride) gas is 300 sccm, it is possible to completely remove an incrustation (containing silicon as its main ingredient) with a thickness of about 2 $\mu$m in four hours.

The concentration of hydrogen in the amorphous silicon film 302 is also a very important parameter, and it appears that as the hydrogen content is low, a film with superior crystallinity is obtained. Thus, it is preferable to form the amorphous silicon film 302 by a low pressure CVD method. A plasma CVD method may also be used if film forming conditions are optimized.

It is effective to add an impurity element (element in group 13, typically boron, or element in group 15, typically phosphorus) for controlling the threshold voltage (Vth) of a TFT at film formation of the amorphous silicon film 302. It is necessary to determine the amount of addition in view of Vth in the case where the above impurity for controlling Vth is not added.

Next, crystallizing steps of the amorphous silicon film 302 are carried out. A technique disclosed in Japanese Patent Application Laid-open No. Hei 7-130652 is used as a means for crystallization. Although both means of embodiment 1 and embodiment 2 disclosed in the publication may be used, in this embodiment, it is preferable to use the technical contents (described in detail in Japanese Patent Application Laid-open No. Hei 8-78329) set forth in the embodiment 2 of the publication. The entire disclosures of these Japanese Patent Applications are incorporated herein by reference.

According to the technique disclosed in Japanese Patent Application Laid-open No. Hei 8-78329, a mask insulating film 303 for selecting an added region of a catalytic element is first formed. The mask insulating film 303 has a plurality of openings for addition of the catalytic element. Positions of crystal regions can be determined by the positions of the openings.

Figure 3A:
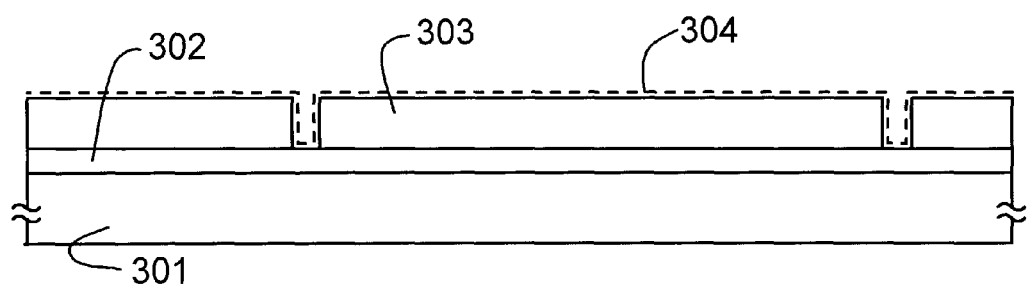
FIGS. 3A to 3D, 4A to 4D, 5A to 5C, and 6 are views showing exemplary manufacturing steps of an active matrix type liquid crystal display device including a thin film transistor circuit of the present invention.

A solution containing nickel (Ni) as the catalytic element for facilitating the crystallization of the amorphous silicon film is applied by a spin coating method to form a Ni containing layer 304. As the catalytic element, cobalt (Co), iron (Fe), palladium (Pd), germanium (Ge), platinum (Pt), copper (Cu), gold (Au), or the like may be used other than nickel (FIG. 3A).

As the foregoing adding step of the catalytic element, an ion implantation method or a plasma doping method using a resist mask may also be used. In this case, since it becomes easy to decrease an occupied area of an added region and to control a growth distance of a lateral growth region, the method is an effective technique when a minute circuit is formed.

Next, after the adding step of the catalytic element is ended, dehydrogenating is carried out at about 500° C. for 2 hours, a heat treatment is carried out in an inert gas atmosphere, hydrogen atmosphere, or oxygen atmosphere at a temperature of 500 to 700° C. (typically 550 to 650° C., preferably 570° C.) for 4 to 24 hours to crystallize the amorphous silicon film 302. In this embodiment, a heat treatment is carried out in a nitrogen atmosphere, at 570° C., and for 14 hours.

Figure 3B:
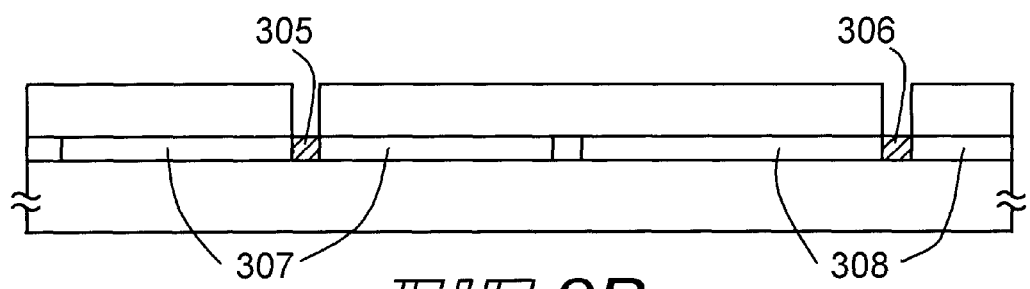

At this time, crystallization of the amorphous silicon film 302 progresses first from nuclei produced in regions 305 and 306 added with nickel, and crystal regions 307 and 308 grown almost parallel to the surface of the substrate 301 are formed. The crystal regions 307 and 308 are respectively referred to as a lateral growth region. Since respective crystals in the lateral growth region are gathered in a comparatively uniform state, the lateral growth region has such an advantage that the total crystallinity is superior (FIG. 3B).

Incidentally, even in the case where the technique set forth in embodiment 1 of the above-mentioned Japanese Patent Application Laid-open No. Hei 7-130652 is used, a region which can be called a lateral growth region is microscopically formed. However, since production of nuclei occurs irregularly in the surface, it is difficult to control crystal grain boundaries.

Figure 3C:
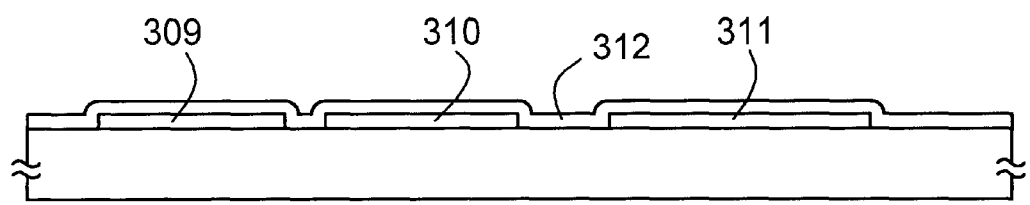

After the heat treatment for crystallization is ended, the mask insulating film 303 is removed and patterning is carried out, so that island-like semiconductor layers (active layers) 309, 310, and 311 made of the lateral growth regions 307 and 308 are formed (FIG. 3C).

Here, reference numeral 309 denotes the active layer of the N-channel TFT constituting the CMOS circuit, 310 denotes the active layer of the P-channel TFT constituting the CMOS circuit, and 311 denotes the active layer of the N-channel TFT (pixel TFT) constituting the pixel matrix circuit.

After the active layers 309, 310 and 311 are formed, a gate insulating film 312 made of an insulating film containing silicon is formed thereon (FIG. 3C).

Figure 3D:

Next, as shown in FIG. 3D, a heat treatment (gettering process for the catalytic element) for removing or reducing the catalytic element (nickel) is carried out. In this heat treatment, a halogen element is contained in a processing atmosphere and the gettering effect for a metallic element by the halogen element is used.

In order to sufficiently obtain the gettering effect by the halogen element, it is preferable to carry out the above heat treatment at a temperature exceeding 700° C. If the temperature is not higher than 700° C., it becomes difficult to decompose a halogen compound in the processing atmosphere, so that there is a fear that the gettering effect can not be obtained.

Thus, in this embodiment, the heat treatment is carried out at a temperature exceeding 700° C., preferably 800 to 1000° C. (typically 950° C.), and a processing time is 0.1 to 6 hours, typically 0.5 to 1 hour.

In this embodiment, there is shown an example in which a heat treatment is carried out in an oxygen atmosphere containing hydrogen chlorine (HCl) of 0.5 to 10 vol % (in this embodiment, 3 vol %) at 950° C. for 30 minutes. If the concentration of HCl is higher than the above-mentioned concentration, since asperities comparable to a film thickness are produced on the surfaces of the active layers 309, 310 and 311, such a high concentration is not preferable.

Although an example in which the HCl gas is used as a compound containing a halogen element has been described, one kind or plural kinds of gases selected from compounds containing halogen, such as typically HF, $NF_3$, HBr, $Cl_2$, $ClF_3$, $BCl_2$, $F_2$, and $Br_2$, may be used other than the HCl gas.

In this step, it is conceivable that nickel is removed in such a manner that nickel in the active layers 309, 310 and 311 is gettered by the action of chlorine and is transformed into volatile nickel chloride which is released into the air. By this step, the concentration of nickel in the active layers 309, 310 and 311 is lowered down to $5 \times 10^{17}$ atoms/cm$^3$ or less.

Incidentally, the value of $5 \times 10^{17}$ atoms/cm$^3$ is the lower limit of detection in the SIMS (Secondary Ion Mass Spectroscopy). As the result of analysis of TFTs experimentally produced by the present applicant, when the concentration is not higher than $1 \times 10^{18}$ atoms/cm$^3$ (preferably $5 \times 10^{17}$ atoms/cm$^3$ or less), an influence of nickel upon TFT characteristics is not ascertained. However, the concentration of an impurity in the present specification is defined as the minimum value in measurement results of the SIMS analysis.

By the above heat treatment, a thermal oxidation reaction progresses at the interface between the gate insulating film 312 and the active layers 309, 310 and 311, so that the thickness of the gate insulating film 312 is increased by the thickness of a thermal oxidation film. When the thermal oxidation film is formed in this way, it is possible to obtain an interface of semiconductor/insulating film, which has very small interfacial levels. Moreover, there is also an effect to prevent inferior formation (edge thinning) of the thermal oxidation film at the end of the active layer.

The gettering process of the catalytic element may be effectively carried out after the mask insulating film 303 is removed and before the active layer is patterned. And also, the gettering process of the catalytic element may be carried out after the active layer is patterned. Besides, any gettering processes may be combined.

Incidentally, the gettering process of the catalytic element can also be carried out by using P (phosphorus). The gettering process by phosphorus may be combined with the foregoing gettering process. Only the gettering process by phosphorus may be used.

Further, it is also effective that after the heat treatment in the above-mentioned halogen atmosphere is carried out, a heat treatment approximately at 950° C. for one hour is carried out in a nitrogen atmosphere to improve the film quality of the gate insulating film 312.

Incidentally, it is also ascertained by the SIMS analysis that the halogen element, which has been used for the gettering process, having a concentration of $1 \times 10^{15}$ to $1 \times 10^{20}$ atoms/cm$^3$ remains in the active layers 309, 310 and 311. Moreover, it is also ascertained by the SIMS analysis that at that time, the foregoing halogen element with a high concentration is distributed between the thermal oxidation film formed by the heat treatment and the active layers 309, 310 and 311.

Moreover, as the result of the SIMS analysis for other elements, it is ascertained that the concentration of any of C(carbon), N (nitrogen), O (oxygen), and S (sulfur) as typical impurities is less than $5 \times 10^{18}$ atoms/cm$^3$ (typically $1 \times 10^{18}$ atoms/cm$^3$ or less).

The lateral growth region of the thus obtained active layer has a unique crystal structure made of a collective of rod-like or flattened rod-like crystals. The features of the unique crystal structure will be described later.

Figure 4A:
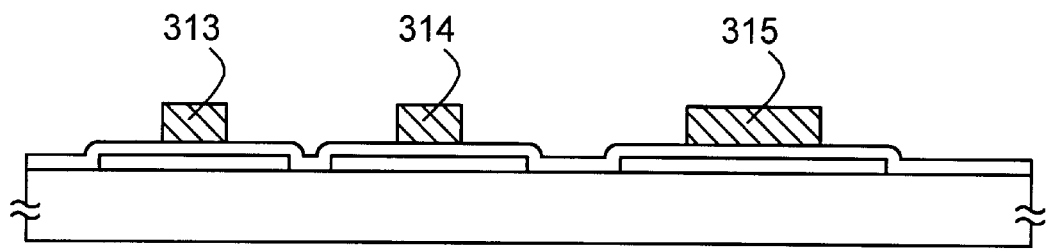

Next, reference will be made to FIGS. 4A to 4D. First, a not-shown metal film containing aluminum as its main ingredient is formed, and originals 313, 314 and 315 of subsequent gate electrodes are formed by patterning. In this embodiment, an aluminum film containing scandium of 2 wt % is used (FIG. 4A).

Incidentally, a polycrystal silicon film may be used for the gate electrode, instead of the aluminum film containing scandium of 2 wt %.

Figure 4B:
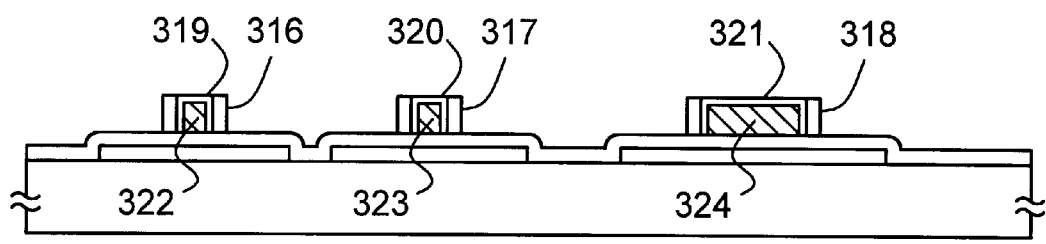
Figure 4C:
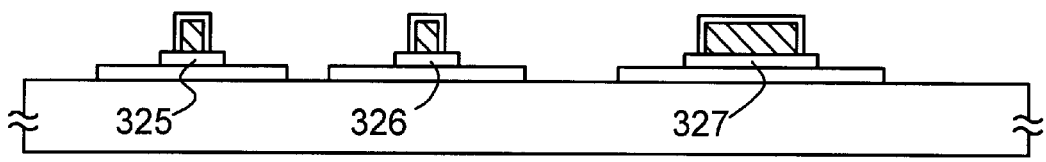

Next, by a technique disclosed in Japanese Patent Application Laid-open No. Hei 7-135318, porous anodic oxidation films 316, 317 and 318, nonporous anodic oxidation films 319, 320 and 321, and gate electrodes 322, 323 and 324 are formed (FIG. 4B). The entire disclosure of this Japanese Patent Application is incorporated herein by reference.

After the state shown in FIG. 4B is obtained in this way, the gate insulating film 312 is next etched by using the gate electrodes 322, 323 and 324, and the porous anodic oxidation films 316, 317 and 318 as masks. Then the porous anodic oxidation films 316, 317 and 318 are removed to obtain the state shown in FIG. 4C. Incidentally, reference numerals 325, 326 and 327 in FIG. 4C denote gate insulating films after processing.

Next, an adding step of impurity elements giving one conductivity is carried out. As the impurity elements, P (phosphorus) or As (arsenic) may be used for an N-channel type, and B (boron) or Ga (gallium) may be used for a P type.

In this embodiment, each of adding steps of impurities for forming an N-channel TFT and a P-channel TFT is divided into two steps and is carried out.

First, the addition of impurities for forming the N-channel TFT is carried out. The first impurity addition (P (phosphorus) is used in this embodiment) is carried out at a high acceleration voltage of about 80 KeV to form an n$^-$ region. Adjustment is made so that the concentration of the P ion in the n$^-$ region becomes $1 \times 10^{18}$ atoms/cm$^3$ to $1 \times 10^{19}$ atoms/cm$^3$.

Further, the second impurity addition is carried out at a low acceleration voltage of about 10 KeV to form an n$^+$ region. Since the acceleration voltage is low at this time, the gate insulating film functions as a mask. Adjustment is made so that the sheet resistance of the n$^+$ region becomes 500 Å or less (preferably 300 Å or less).

Through the above described steps, a source region 328, a drain region 329, a low concentration impurity region 330, and a channel formation region 331 of the N-channel TFT constituting the CMOS circuit are formed. Moreover, a source region 332, a drain region 333, a low concentration impurity region 334, and a channel formation region 335 of the N-channel TFT constituting the pixel TFT are defined (FIG. 4D).

Figure 4D:
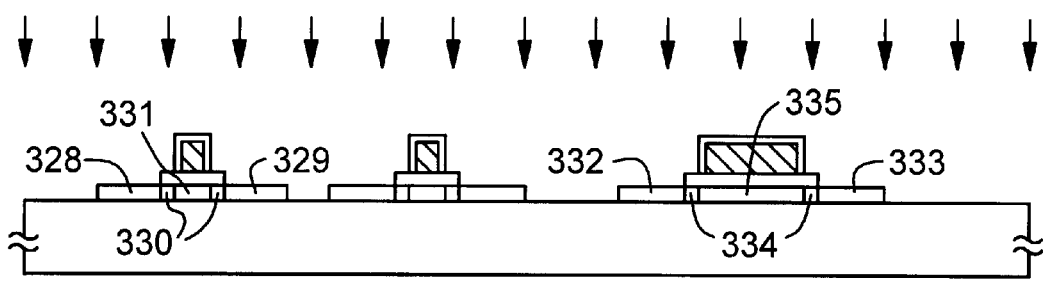

In the state shown in FIG. 4D, the active layer of the P-channel TFT constituting the CMOS circuit has the same structure as the active layer of the N-channel TFT.

Figure 5A:
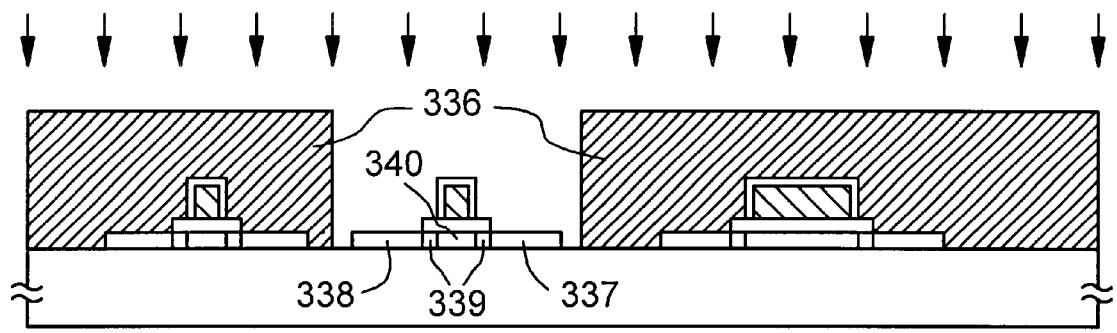

Next, as shown in FIG. 5A, a resist mask 336 covering the N-channel TFTs is provided, and an impurity ion for giving a P type (boron is used in this embodiment) is added.

Although this step is also divided and is carried out two times as the foregoing adding step of the impurity, since the N-channel type must be inverted into the P-channel type, the B (boron) ion with a concentration several times higher than the foregoing addition concentration of the P ion is added.

In this way, a source region 337, a drain region 338, a low concentration impurity region 339, and a channel formation region 340 of the P-channel TFT constituting the CMOS circuit are formed (FIG. 5A).

After the active layer is completed in the manner as described above, activation of the impurity ions is made by combination of furnace annealing, laser annealing, lamp annealing, and the like. At the same time, damages of the active layers caused in the adding steps are repaired.

Next, as an interlayer insulating film 341, a laminated film of a silicon oxide film and a silicon nitride film is formed. Then, after contact holes are formed, source electrodes 342, 343 and 344, and drain electrodes 345 and 346 are formed to obtain the state shown in FIG. 5B. An organic resin film may be used as the interlayer insulating film 341.

Figure 5B:
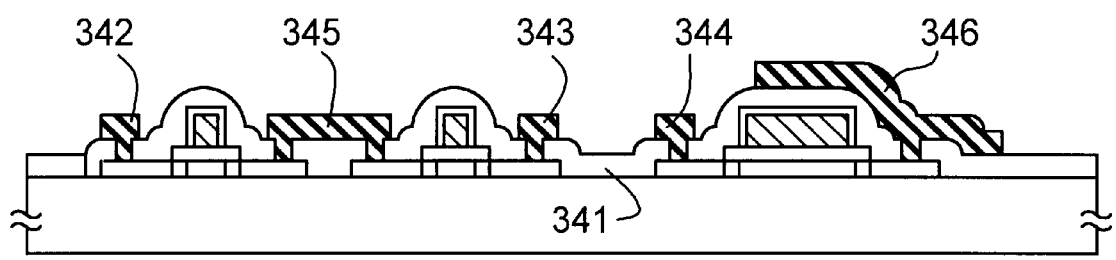

After the state shown in FIG. 5B is obtained, a first interlayer insulating film 347 made of an organic resin film and having a thickness of 0.5 to 3 μm is formed. Polyimide, acryl, polyimide amide, or the like may be used for the organic resin film. The merits of using the organic resin film are listed as follows: a film forming method is simple, a film thickness can be easily increased, parasitic capacitance can be reduced since its relative dielectric constant is low, and flatness is excellent. An organic resin film other than the above may be used.

Next, a black matrix 348 made of a film having shading properties and having a thickness of 100 nm is formed on the first interlayer insulating film 347. Although a titanium film is used as the black matrix 348 in this embodiment, a resin film containing black pigments, or the like may be used.

Incidentally, in the case where the titanium film is used for the black matrix 348, part of wiring lines of a driver circuit or other peripheral circuit portions can be formed of titanium. The wiring lines of titanium can be formed at the same time as the formation of the black matrix 348.

Figure 5C:
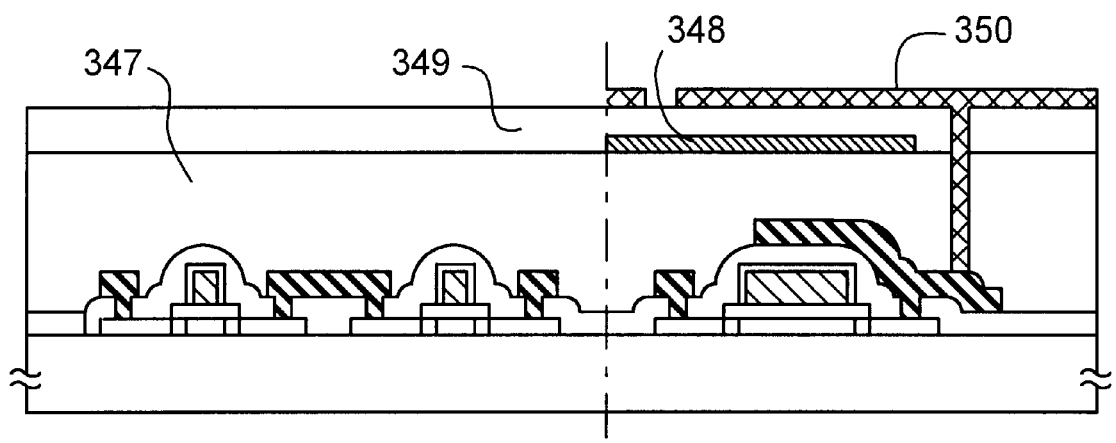

After the black matrix 348 is formed, a second interlayer insulating film 349 made of one of a silicon oxide film, a silicon nitride film, and an organic resin film, or a laminated film thereof and having a thickness of 0.1 to 0.3 μm is formed. Then a contact hole is formed in the interlayer insulating film 347 and the interlayer insulating film 349, and a pixel electrode 350 with a thickness of 120 nm is formed. According to the structure of this embodiment, auxiliary capacitance is formed at a region where the black matrix 348 overlaps with the pixel electrode 350 (FIG. 5C). Since this embodiment relates to a transmission type active matrix liquid crystal display device, a transparent conductive film of ITO or the like is used as a conductive film forming the pixel electrode 350.

Next, the entirety of the substrate is heated in a hydrogen atmosphere at a temperature of 350° C. for 1 to 2 hours to hydrogenate the entirety of the device, so that the dangling bonds (unpaired bonds) in the film (especially in the active layer) are compensated. Through the above steps, it is possible to manufacture the CMOS circuit and the pixel matrix circuit on the same substrate.

Figure 6:
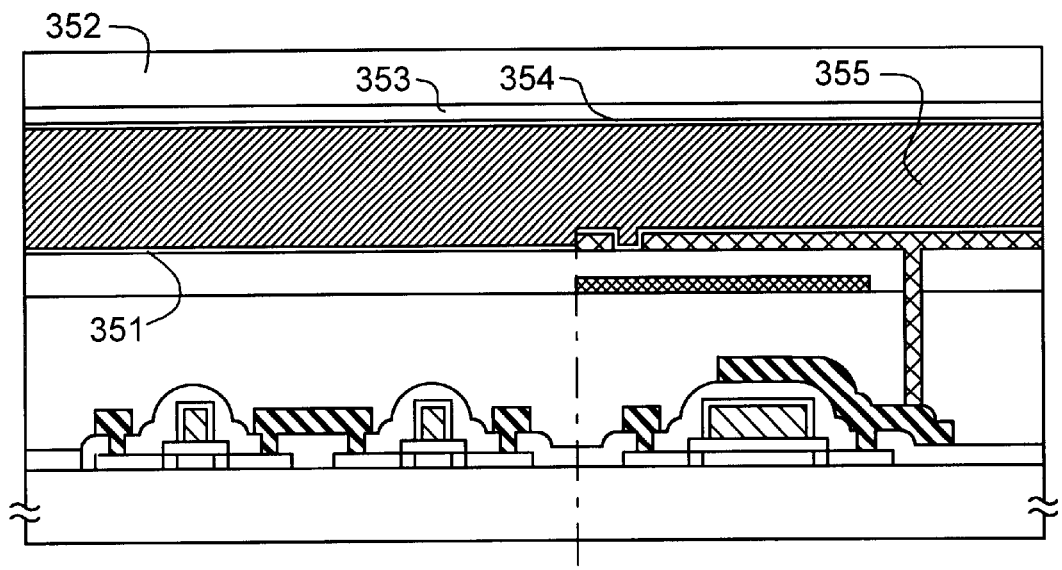

Next, with reference to FIG. 6, a step of manufacturing an active matrix type liquid crystal display device using the active matrix substrate manufactured through the above steps will be described.

An oriented film 351 is formed on the active matrix substrate in the state of FIG. 5C. In this embodiment, polyimide is used for the oriented film 351. Next, an opposite substrate is prepared. The opposite substrate is constituted of a glass substrate 352, a transparent conductive film 353, and an oriented film 354.

In this embodiment, such a polyimide film that liquid crystal molecules are oriented parallel to the substrate is used as the oriented film. Incidentally, after the oriented film is formed, a rubbing process is carried out so that the liquid crystal molecules are parallel oriented with a uniform pretilt angle.

Next, the active matrix substrate obtained through the above steps and the opposite substrate are bonded to each other by a known cell-assembling step through a sealing material, a spacer, and the like (not shown). Thereafter, a liquid crystal material 355 is injected between both the substrates, and is completely sealed with a sealing agent (not shown). Thus, the transmission type active matrix liquid crystal display device shown in FIG. 6 is completed.

Various known liquid crystal materials such as twisted nematic liquid crystal, polymer dispersion liquid crystal, ferroelectric liquid crystal, anti-ferroelectric liquid crystal, or a mixture of ferroelectric and anti-ferroelectric liquid crystals may be used in the liquid crystal display of this embodiment.

Figure 7:
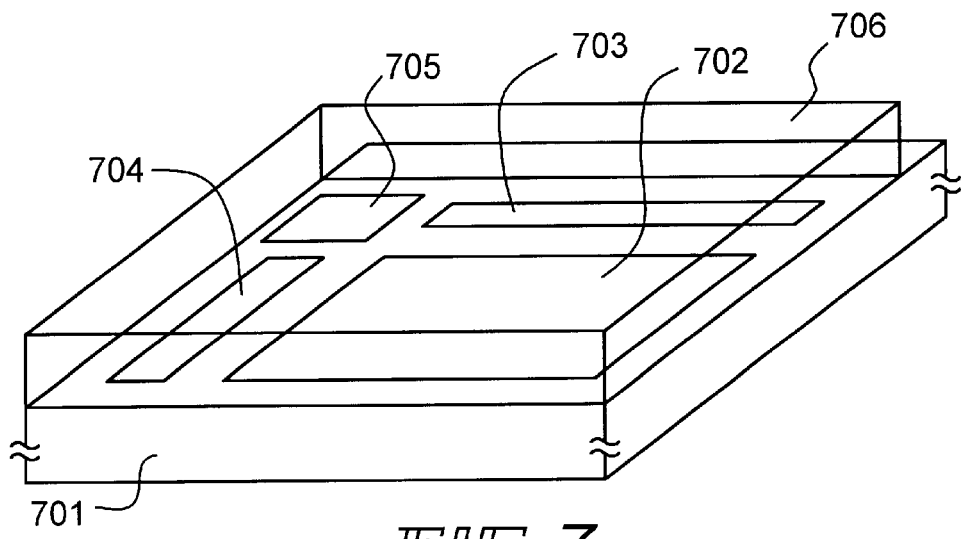
FIG. 7 is a perspective view showing the active matrix type liquid crystal display device including the thin film transistor circuit of the present invention.

FIG. 7 is a perspective view showing a completed active matrix type liquid crystal display device. Reference numeral 701 denotes an active matrix substrate, 702 denotes a pixel matrix circuit, 703 denotes a source signal line side driver circuit, 704 denotes a gate signal line side driver circuit, 705 denotes another peripheral circuit, and 706 denotes an opposite substrate. As shown in FIG. 7, in the active matrix type liquid crystal display device of this embodiment, the active matrix substrate is exposed only at an end surface where an FPC is attached, and other three end surfaces of the active matrix substrate are flush with those of the opposite substrate.

Incidentally, in this embodiment, the liquid crystal display device is designed to make display with a TN (twisted nematic) mode. Thus, a pair of polarizing plates (not shown) are disposed so that the liquid crystal panel is held between the polarizing plates in crossed Nicols (in such a state that polarizing axes of the pair of polarizing plates cross each other at right angles).

Thus, it is understood that in this embodiment, display is made in a normally white mode in which white display is effected when a voltage is not applied to the liquid crystal display device.

It is understood that through the above described manufacturing method, in the active matrix type liquid crystal display device of this embodiment, the driver circuit, other peripheral devices, and pixels can be integrally formed on the insulating substrate such as a quartz substrate or a glass substrate.

[Embodiment 2]

FIG. 8 shows another embodiment of the present invention. FIG. 8 shows a case where the structure of the present invention is used for an analog buffer of a source signal line side driver circuit of an active matrix type semiconductor display device. In this embodiment, the number of output-side thin film transistors of a differential circuit and that of a current mirror circuit are respectively made to be three times as large as that of the foregoing embodiment 1. In other words, the output-side circuits of the differential circuit and the current mirror circuit are respectively multiplied by three. By this, the current capacity of the constructed analog buffer is increased.

In this embodiment, the channel width of each of 12 P-channel TFTs constituting the differential amplifier is 30 $\mu$m. The channel width of each of N-channel TFTs constituting the current mirror circuit is 30 $\mu$m. In this embodiment, although the channel width of each TFT is 30 $\mu$m, it is appropriate that the width is 100 $\mu$m or less (preferably 90 $\mu$m or less).

The operation of the analog buffer of this embodiment will be described. In the case where an electric potential at an input end 802 is decreased, almost all current of a constant current source 800 flows through input-side P-channel TFTs of a differential circuit A, and also flows to the input of a current mirror circuit B. Since the number of output-side TFTs of the current mirror circuit is three times as large as that of the input-side TFTs, it is possible to take in a current three times that of the constant current source from an output terminal, and it is possible to drive a source signal line connected to an output end 803 at high speed. When the electric potential at the input end becomes almost equal to that at the output end, the current of the constant current source is divided to the output-side TFTs and to the input-side TFTs. In this case, the ratio of the number of TFTs of the differential circuit is 1:3 between the input-side and the output-side, and the ratio of the number of TFTs of the current mirror circuit is 1:3 between the input-side and the output-side, so that the electric potential at the input end and the electric potential at the output end are not affected by the number of TFTs.

In this embodiment, although the number of TFTs in the differential circuit and the current mirror circuit is made three times as large as that of the embodiment 1, the present invention is not limited to this. That is, in the differential circuit, the number of output-side thin film transistors can be made n times (that is, (n×x) transistors), and in the current mirror circuit, the number of output-side thin film transistors can be made n times (that is, (n×y) transistors).

[Embodiment 3]

The active matrix type liquid crystal display device of the present invention described in the embodiments 1 and 2 can sufficiently be used for an active matrix type liquid crystal display device with high fineness/high resolution, and the number of pixels is so enormous that the device can be applied to a future ATV (Advanced TV). Thus, the present invention can also be used for an active matrix type liquid crystal display device with the resolution of XGA or higher, for example, 1920 horizontal pixels by 1280 vertical pixels.

[Embodiment 4]

The active matrix type liquid crystal display device described in the foregoing embodiments 1 to 3 can be used for both a transmission type active matrix type liquid crystal display device and a reflection type active matrix type liquid crystal display device. A thresholdless antiferroelectric liquid crystal may be used as a liquid crystal material. The present invention can also meet requirements of a case where a ferroelectric liquid crystal is used as a liquid crystal material, and a memory effect of the ferroelectric liquid crystal is eliminated by a specific oriented film or the like.

In the foregoing embodiments 1 to 3, although explanation has been made for a case where a liquid crystal is used as a display medium, the present invention may be used for a semiconductor display device including any other display medium in which optical characteristics can be modulated in response to applied voltage. For example, an electroluminescence element, an electrochromics element, or the like may be used as a display medium.

The TFT used in the foregoing embodiments 1 to 3 may be a top-gate type or a reverse stagger type.

[Embodiment 5]

The semiconductor display device of the foregoing embodiments 1 to 4 has various uses. In this embodiment, semiconductor devices each including such an active matrix type semiconductor display device using a thin film transistor circuit of the present invention will be described.

As such semiconductor devices, a video camera, a still camera, a projector, a head mount display, a car navigation system, a personal computer, a portable information terminal (mobile computer, portable telephone, etc.) and the like are enumerated. Examples of those are shown in FIGS. 9A to 9F.

Figure 9A:
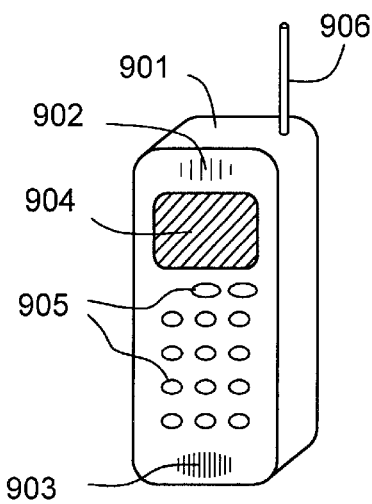
FIGS. 9A to 9F are views showing examples of semiconductor devices each including a semiconductor display device with a thin film transistor circuit of the present invention.

FIG. 9A shows a portable telephone which is constituted of a main body 901, a voice output portion 902, a voice input portion 903, a semiconductor display device 904, an operation switch 905, and an antenna 906.

Figure 9B:
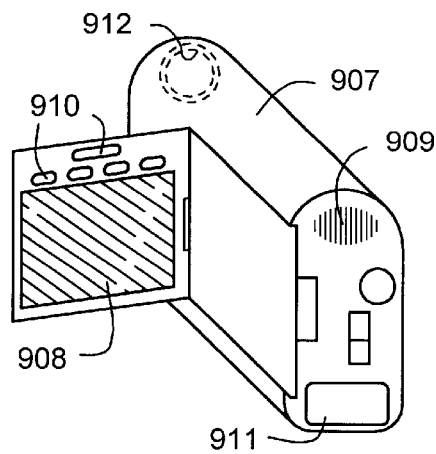

FIG. 9B shows a video camera which is constituted of a main body 907, a semiconductor display device 908, a voice input portion 909, an operation switch 910, a battery 911, and an image receiving portion 912.

Figure 9C:
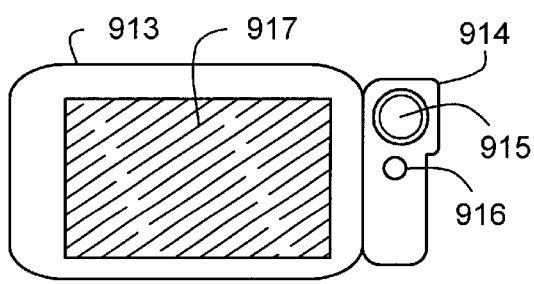

FIG. 9C shows a mobile computer which is constituted of a main body 913, a camera portion 914, an image receiving portion 915, an operation switch 916, and a semiconductor display device 917.

Figure 9D:
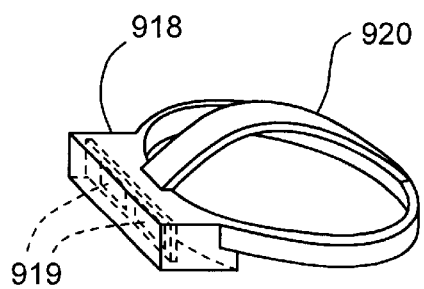

FIG. 9D shows a head mount display which is constituted of a main body 918, a semiconductor display device 919, and a band portion 920.

Figure 9E:
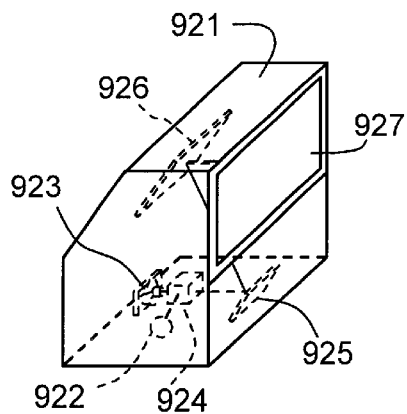

FIG. 9E shows a rear type projector which is constituted of a main body 921, a light source 922, a semiconductor display device 923, a polarizing beam splitter 924, reflectors 925 and 926, and a screen 927. Incidentally, in the rear type projector, it is preferable that an angle of the screen can be changed while the main body is fixed, according to the position where a viewer sees the screen. When three such semiconductor display devices 923 (each corresponding to light of R, G, or B) are used, it is possible to realize a rear type projector with further high resolution/high fineness.

Figure 9F:
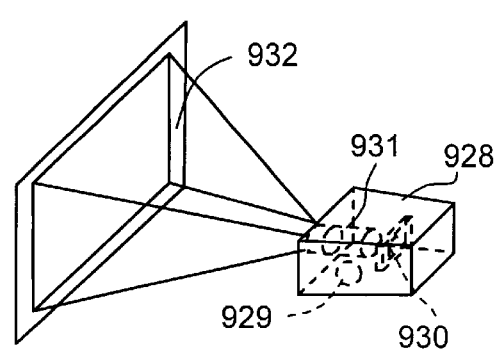
Figure 10:
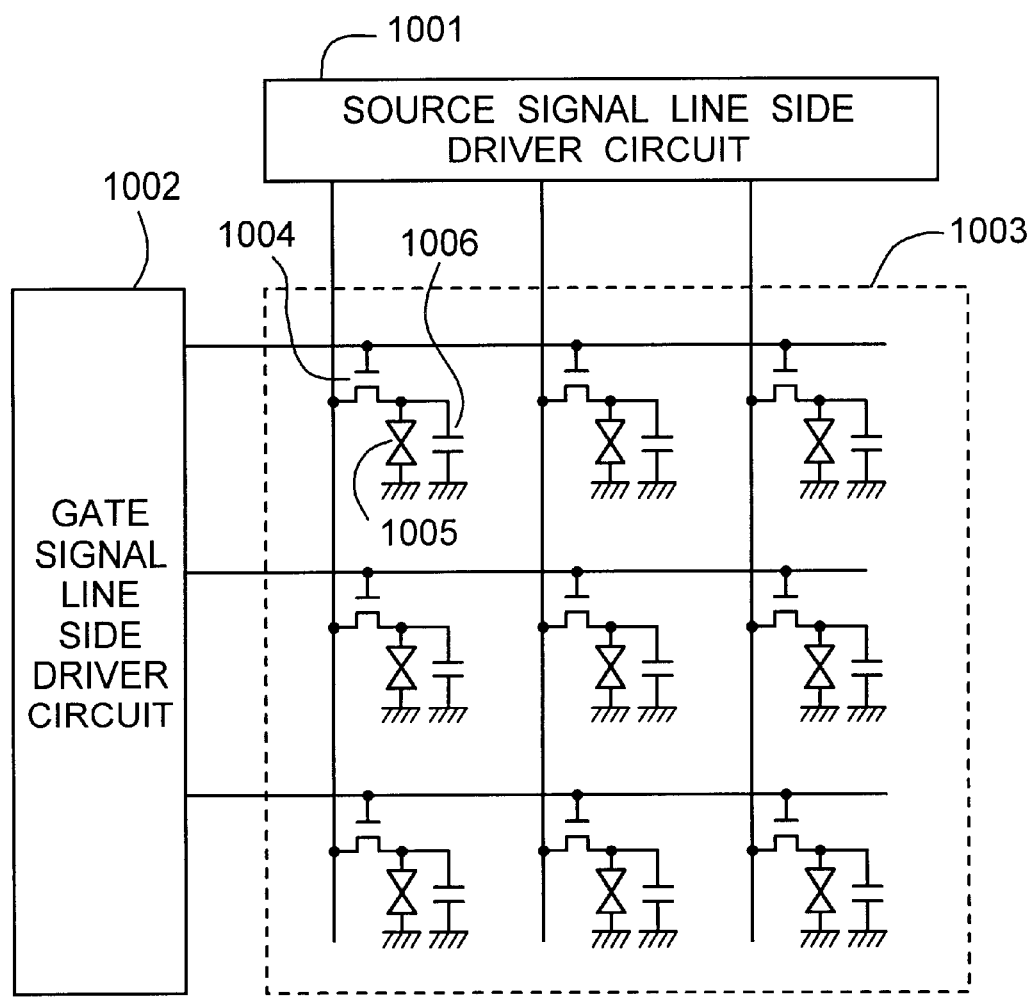
FIG. 10 is a schematic structural view of an active matrix type liquid crystal display device.
Figure 11:
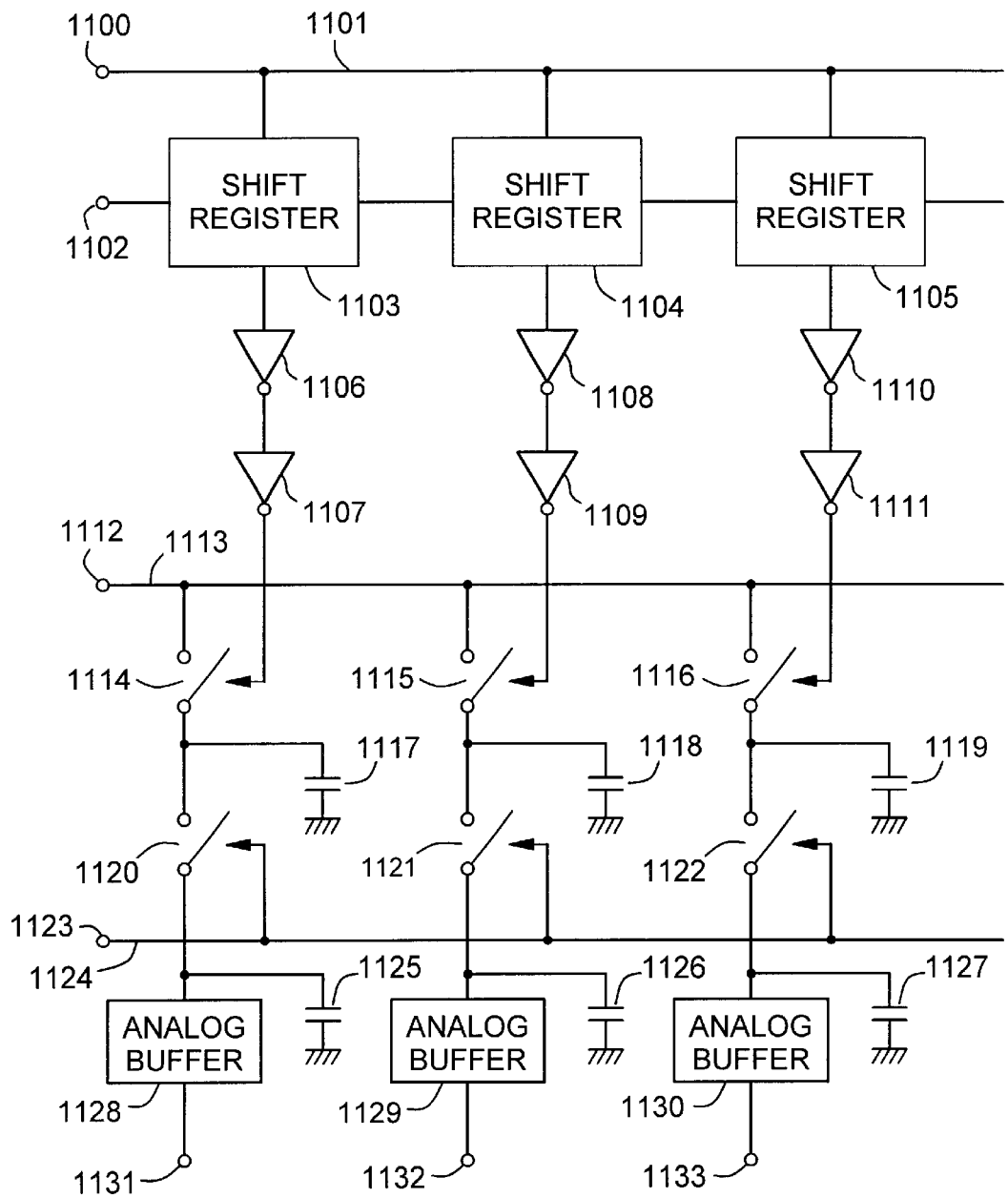
FIG. 11 is a view showing an example of a source signal line side driver circuit.
Figure 12:
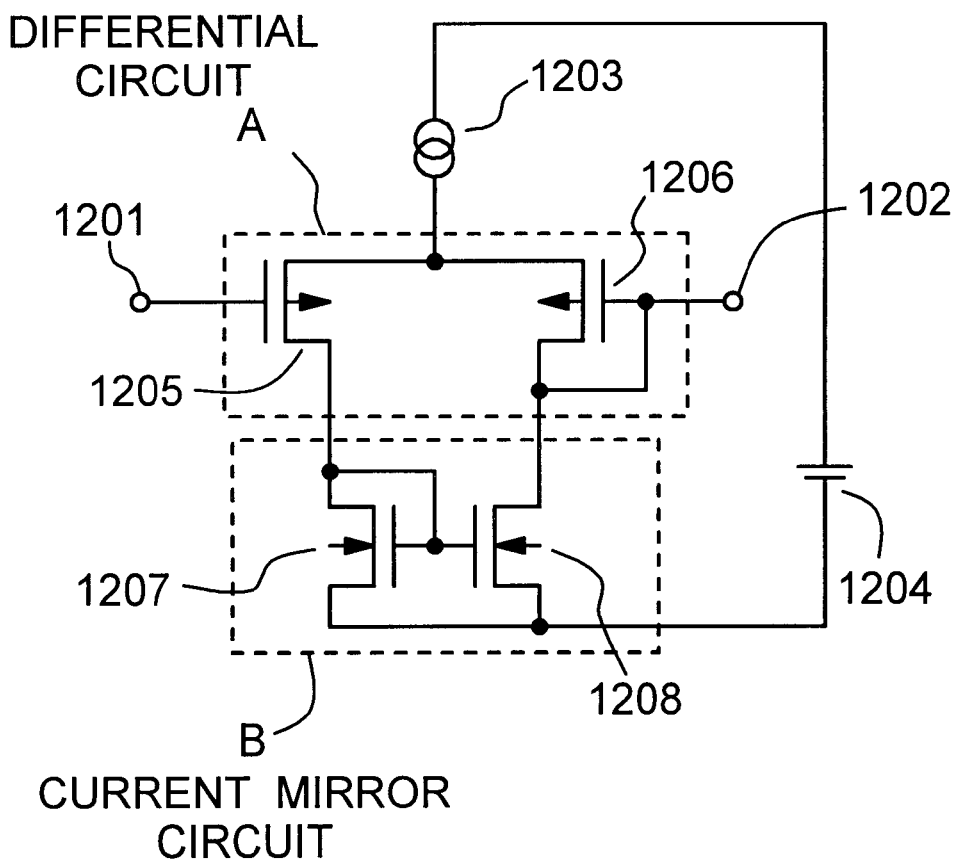
FIG. 12 is a circuit diagram of a conventional analog buffer.

FIG. 9F shows a front type projector which is constituted of a main body 928, a light source 929, a semiconductor display device 930, an optical system 931, and a screen 932. When three such semiconductor display devices 930 (each corresponding to light of R, G, or B) are used, it is possible to realize a front type projector with further high resolution/high fineness.

As described above, according to the present invention, fluctuation in characteristics of analog buffers, which is one of the main causes of a picture blur in an active matrix type semiconductor display device, can be reduced to a minimum, so that the active matrix type semiconductor display device with high picture quality can be realized.

What is claimed is:

1. A semiconductor device comprising at least:
   a differential circuit including x (x is a natural number not less than 2) input-side thin film transistors which have a common gate electrode potential and to which a signal is inputted, and x output-side thin film transistors which have a common gate electrode potential and from which a signal is outputted; and
   a current mirror circuit including y (y is a natural number not less than 2) input-side thin film transistors and y output-side thin film transistors, which have a common gate electrode potential, the gate electrodes of y input-side thin film transistors being connected to sources/drains of y input-side thin film transistors.

2. A device according to claim 1 wherein said thin film transistors in said different circuit are different conductivity type from said thin film transistors in said current mirror circuit.

3. A device according to claim 1 wherein each of said thin film transistors in said differential circuits and said mirror circuit comprises:
   a crystalline semiconductor film over a substrate having an insulating surface, said crystalline semiconductor film having at least a channel and said source/drain; and
   said gate electrode adjacent to said crystalline semiconductor film with a gate insulating film interposed therebetween,
   wherein width of said channel is 100 μm or less.

4. A device according to claim 1 wherein said semiconductor device is an active matrix type liquid crystal display device.

5. A device according to claim 1 wherein said semiconductor device is selected from the group consisting of a video camera, a still camera, a rear type projector, a front type projector, a head mount display, a car navigation system, a portable telephone, a mobile computer, and a personal computer.

6. A semiconductor device comprising at least:
   a differential circuit including x (x is a natural number not less than 2) input-side thin film transistors which have a common gate electrode potential and to which a signal is inputted, and (n n x) (n is a natural number not less than 2) output-side thin film transistors which have a common gate electrode potential and from which a signal is outputted; and
   a current mirror circuit including y (y is a natural number not less than 2) input-side thin film transistors and (n n y) output-side thin film transistors, which have a common gate electrode potential, the gate electrodes of y input-side thin film transistors being connected to source/drain regions of y input-side thin film transistors.

7. A device according to claim 6 wherein said thin film transistors in said different circuit are different conductivity type from said thin film transistors in said current mirror circuit.

8. A device according to claim 6 wherein each of said thin film transistors in said differential circuits and said mirror circuit comprises:
   a crystalline semiconductor film over a substrate having an insulating surface, said crystalline semiconductor film having at least a channel and said source/drain; and
   said gate electrode adjacent to said crystalline semiconductor film with a gate insulating film interposed therebetween,
   wherein width of said channel is 100 μm or less.

9. A device according to claim 6 wherein said semiconductor device is an active matrix type liquid crystal display device.

10. A device according to claim 6 wherein said semiconductor device is selected from the group consisting of a video camera, a still camera, a rear type projector, a front type projector, a head mount display, a car navigation system, a portable telephone, a mobile computer, and a personal computer.

11. A semiconductor device comprising:
    a pixel matrix region; and
    a driver circuit comprising at least a thin film transistor circuit, the thin film transistor circuit comprising: a differential circuit including x (x is a natural number not less than 2) input-side thin film transistors which have a common gate electrode potential and to which a signal is inputted, and x output-side thin film transistors which have a common gate electrode potential and from which a signal is outputted; and a current mirror circuit including y (y is a natural number not less than 2) input-side thin film transistors and y output-side thin film transistors, which have a common gate electrode potential, the gate electrodes of y input-side thin film transistors being connected to source/drain regions of y input-side thin film transistors, wherein the pixel matrix region and the driver circuit are formed on the same substrate.

12. A device according to claim 11 wherein said thin film transistors in said different circuit are different conductivity type from said thin film transistors in said current mirror circuit.

13. A device according to claim 11 wherein each of said thin film transistors in said differential circuits and said mirror circuit comprises:

a crystalline semiconductor film over said substrate having an insulating surface, said crystalline semiconductor film having at least a channel and said source/drain; and said gate electrode adjacent to said crystalline semiconductor film with a gate insulating film interposed therebetween, wherein width of said channel is 100 $\mu$m or less.

14. A device according to claim 11 wherein said semiconductor device is an active matrix type liquid crystal display device.

15. A device according to claim 11 wherein said semiconductor device is selected from the group consisting of a video camera, a still camera, a rear type projector, a front type projector, a head mount display, a car navigation system, a portable telephone, a mobile computer, and a personal computer.

16. A semiconductor device comprising:

a pixel matrix region; and a driver circuit comprising at least a thin film transistor circuit, the thin film transistor circuit comprising at least: a differential circuit including x (x is a natural number not less than 2) input-side thin film transistors which have a common gate electrode potential and to which a signal is inputted, and (n n x) (n is a natural number not less than 2) output-side thin film transistors which have a common gate electrode potential and from which a signal is outputted; and a current mirror circuit including y (y is a natural number not less than 2) input-side thin film transistors and (n×y) output-side thin film transistors, which have a common gate electrode potential, the gate electrodes of y input-side thin film transistors are connected to source/drain regions of y input-side thin film transistors, wherein the pixel matrix region and the driver circuit are formed on the same substrate.

17. A device according to claim 16 wherein said thin film transistors in said different circuit are different conductivity type from said thin film transistors in said current mirror circuit.

18. A device according to claim 16 wherein each of said thin film transistors in said differential circuits and said mirror circuit comprises:

a crystalline semiconductor film over said substrate having an insulating surface, said crystalline semiconductor film having at least a channel and said source/drain; and said gate electrode adjacent to said crystalline semiconductor film with a gate insulating film interposed therebetween, wherein width of said channel is 100 $\mu$m or less.

19. A device according to claim 16 wherein said semiconductor device is an active matrix type liquid crystal display device.

20. A device according to claim 16 wherein said semiconductor device is selected from the group consisting of a video camera, a still camera, a rear type projector, a front type projector, a head mount display, a car navigation system, a portable telephone, a mobile computer, and a personal computer.

21. A semiconductor device comprising a pixel matrix region and a driver circuit having at least one buffer circuit, said buffer circuit comprising:

a differential circuit having x input-side thin film transistors connecting in parallel to each other (x≧2, x is natural number) and n×x output-side thin film transistors connecting in parallel to each other (n≧1, n is natural number), and a current mirror circuit having y input-side thin film transistors connecting in parallel to each other (y≧2, y is natural number) and n×y output-side thin film transistors connecting in parallel to each other (n≧1, n is natural number).

22. A device according to claim 21 wherein said thin film transistors in said different circuit are different conductivity type from said thin film transistors in said current mirror circuit.

23. A device according to claim 21 wherein each of said thin film transistors in said differential circuits and said mirror circuit comprises:

a crystalline semiconductor film over said substrate having an insulating surface, said crystalline semiconductor film having at least a channel and said source/drain; and said gate electrode adjacent to said crystalline semiconductor film with a gate insulating film interposed therebetween, wherein width of said channel is 100 $\mu$m or less.

24. A device according to claim 21 wherein said semiconductor device is an active matrix type liquid crystal display device.

25. A device according to claim 21 wherein said semiconductor device is selected from the group consisting of a video camera, a still camera, a rear type projector, a front type projector, a head mount display, a car navigation system, a portable telephone, a mobile computer, and a personal computer.

26. A semiconductor device comprising a pixel matrix region and a driver circuit having at least one buffer circuit, said buffer circuit comprising:

a differential circuit having a plurality of thin film transistors connecting in parallel to each other and dividing an input into x and a plurality of thin film transistors connecting in parallel to each other and dividing an output into n×x (n≧1, n is natural number), respectively, and a current mirror circuit having a plurality of thin film transistors connecting in parallel to each other and dividing an input into y and a plurality of thin film transistors connecting in parallel to each other and dividing an output into n×y (n≧1, n is natural number), respectively.

27. A device according to claim 26 wherein said thin film transistors in said different circuit are different conductivity type from said thin film transistors in said current mirror circuit.

28. A device according to claim 26 wherein each of said thin film transistors in said differential circuits and said mirror circuit comprises:

a crystalline semiconductor film over said substrate having an insulating surface, said crystalline semiconductor film having at least a channel and said source/drain; and said gate electrode adjacent to said crystalline semiconductor film with a gate insulating film interposed therebetween, wherein width of said channel is 100 $\mu$m or less.

29. A device according to claim 26 wherein said semiconductor device is an active matrix type liquid crystal display device.

30. A device according to claim 26 wherein said semiconductor device is selected from the group consisting of a video camera, a still camera, a rear type projector, a front type projector, a head mount display, a car navigation system, a portable telephone, a mobile computer, and a personal computer.

* * * * *

UNITED STATES PATENT AND TRADEMARK OFFICE
CERTIFICATE OF CORRECTION

PATENT NO. : 6,268,842 B1
APPLICATION NO. : 09/289306
DATED : July 31, 2001
INVENTOR(S) : Shunpei Yamazaki and Jun Koyama It is certified that error appears in the above-identified patent and that said Letters Patent is hereby corrected as shown below:

In the claims:

Column 16, claim 6, line 30, delete "(n n x)" and insert --(n x x)--;

Column 16, claim 6, lines 35-36, delete "(n n y)" and insert --(n x y)--;

Column 17, claim 16, line 45, delete "(n n x)" and insert --(n x x)--.

Signed and Sealed this

Nineteenth Day of February, 2008

JON W. DUDAS
*Director of the United States Patent and Trademark Office*